United States Patent
Tong et al.

(10) Patent No.: US 6,877,653 B2
(45) Date of Patent: Apr. 12, 2005

(54) METHOD OF MODIFYING TIN TO LEAD RATIO IN TIN-LEAD BUMP

(75) Inventors: Ho-Ming Tong, Taipei (TW); Chun-Chi Lee, Kaohsiung (TW); Jen-Kuang Fang, Pingtung Hsien (TW); Min-Lung Huang, Kaohsiung (TW); Jau-Shoung Chen, Hsinchu Hsien (TW); Ching-Huei Su, Kaohsiung (TW); Chao-Fu Weng, Tainan (TW); Yung-Chi Lee, Kaohsiung (TW); Yu-Chen Chou, Kaohsiung (TW); Tsung-Hua Wu, Kaohsiung Hsien (TW); Su Tao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 24 days.

(21) Appl. No.: 10/248,411

(22) Filed: Jan. 17, 2003

(65) Prior Publication Data

US 2003/0160089 A1 Aug. 28, 2003

(30) Foreign Application Priority Data

Feb. 27, 2002 (TW) ........................ 91103529 A

(51) Int. Cl.[7] ........................ B23K 31/02; B23K 35/24; B23K 31/00
(52) U.S. Cl. ................ 228/180.22; 228/226; 228/248.1
(58) Field of Search .......................... 228/180.22, 225, 228/226, 245, 248.1

(56) References Cited

U.S. PATENT DOCUMENTS

| | | | | |
|---|---|---|---|---|
| 3,512,051 A | * | 5/1970 | Noll | 257/772 |
| 5,075,965 A | * | 12/1991 | Carey et al. | 29/840 |
| 5,634,268 A | * | 6/1997 | Dalal et al. | 29/840 |
| 5,729,896 A | * | 3/1998 | Dalal et al. | 29/840 |
| 5,796,591 A | * | 8/1998 | Dalal et al. | 361/779 |
| 5,922,496 A | * | 7/1999 | Dalal et al. | 430/5 |
| 5,965,945 A | * | 10/1999 | Miller et al. | 257/781 |
| 6,051,273 A | * | 4/2000 | Dalal et al. | 427/124 |
| 6,268,114 B1 | * | 7/2001 | Wen et al. | 430/314 |
| 6,330,967 B1 | * | 12/2001 | Milewski et al. | 228/180.22 |
| 6,344,234 B1 | * | 2/2002 | Dalal et al. | 427/96 |
| 6,348,399 B1 | * | 2/2002 | Lin | 438/616 |
| 6,638,690 B1 | * | 10/2003 | Meier et al. | 430/313 |

FOREIGN PATENT DOCUMENTS

JP 08204322 A * 8/1996

* cited by examiner

*Primary Examiner*—Colleen P. Cooke
(74) *Attorney, Agent, or Firm*—Jianq Chyun IP Office

(57) ABSTRACT

A method of modifying the tin to lead ratio of a tin-lead bump forms a patterned solder mask over a substrate that comprises a first tin-lead bump formed thereon, the patterned solder mask having an opening that exposes the tin-lead bump. A solder material including tin and lead is filled in the opening of the solder mask over the first tin-lead bump. The solder material has a tin to lead ratio that differs from that of the first tin-lead bump. The solder material is reflowed to fuse with the first tin-lead bump, which forms a second tin-lead bump. The tin to lead ratio of the second tin-lead bump is thereby different from that of the first tin-lead bump.

15 Claims, 2 Drawing Sheets

METHOD OF MODIFYING TIN TO LEAD RATIO IN TIN-LEAD BUMP

CROSS REFERENCE TO RELATED APPLICATIONS

This application claims the priority benefit of Taiwan application serial no. 91103529, filed on Feb. 27, 2002.

BACKGROUND OF INVENTION

1. Field of the Invention

The invention relates generally to a method of modifying the tin to lead ratio in a tin-lead bump already formed on a wafer.

2. Description of the Related Art

At the manufacturing stage where an integrated circuit (IC) chip is to be packaged, the commonly called "first level package" usually refers to the mount and connection of the IC chip on a carrier. This mount is generally performed according to three configurations: wire bonding, tape automatic bonding (TAB), or flip chip (F/C) connection. TAB and F/C connection conventionally require the formation of conductive bumps on the bonding pads of the IC chip for mounting and connecting the IC chip on the carrier. Various types of conductive bumps are known in the art, including a gold bump, a conductive polymer bump, a polymer bump, etc. The person skilled in the art however knows that conductive bumps made of tin-lead alloy are the most commonly met in the currently manufactured IC packages.

To form a tin-lead bump, an under bump metallurgy (UBM) is first formed on the bounding pad of the semiconductor wafer via evaporation, sputtering, or plating. A photoresist layer then is formed over the semiconductor wafer, the photoresist layer having an opening that exposes the UBM. A solder material is filled in the opening of the photoresist layer over the UBM. The solder material is reflowed to form the tin-lead bump.

The formed bump has a tin to lead ratio that determines various physical properties of the bump, including its reflow point. This tin to lead ratio is usually obtained at the preparation stage of the solder material before it is filled in the opening of the photoresist layer.

The U.S. Pat. No. 5,803,340, which is incorporated by reference herein, discloses a composite solder paste for flip chip bumping that is formed via mixing a first solder material of lower reflow point and a second solder material of higher reflow point. This composite solder paste is filled in the opening of the photoresist layer and is reflowed at the lower reflow point to form an initial bump. The photoresist layer then is removed, and the semiconductor wafer is diced into individual chips. An individual chip then is mounted on a substrate with the initial bump mounted on a contact pad of the substrate. The initial bump then is reflowed at the higher reflow point to form the final bump that electrically connects the chip to the substrate.

SUMMARY OF INVENTION

An aspect of the invention is therefore to provide a method of modifying the tin to lead ratio of a tin-lead comprising bump and, more particularly, a tin-lead comprising bump that has been formed on a bonding pad, while increasing its height.

To accomplish the above and other objectives, the method of the invention forms a patterned solder mask over a substrate that comprises a bonding pad on which is formed a first tin-lead comprising bump, the patterned solder mask having an opening that exposes the tin-lead comprising bump. A solder material including tin and lead is filled in the opening of the solder mask over the first tin-lead comprising bump. The solder material has a tin to lead ratio that differs from that of the first tin-lead comprising bump. The solder material is reflowed to fuse with the first tin-lead comprising bump, which forms a second tin-lead comprising bump. The second tin-lead comprising bump, formed according to the above method, thereby has a tin to lead ratio different from that of the first tin-lead comprising bump, and has a relatively greater height.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
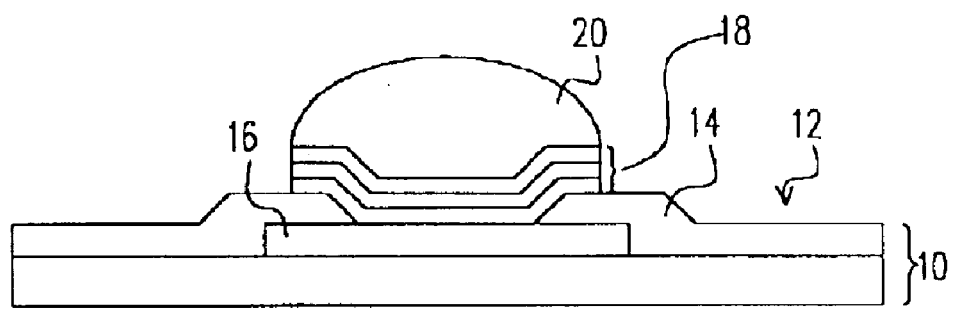
FIG. 1 through FIG. 5 are various views showing different stages in the method of modifying the tin to lead ratio of a tin-lead comprising bump.

The following detailed description of the embodiments and examples of the present invention with reference to the accompanying drawings is only illustrative and not limiting. Furthermore, wherever possible in the description, the same reference symbols will refer to similar elements and parts unless otherwise illustrated in the drawings.

Reference now is made to FIG. 1 through FIG. 5 to describe a method of modifying the tin to lead ratio in a tin-lead bump according to an embodiment of the invention. Hereinafter, "tin-lead bump" is understood as meaning a conductive bump that comprises tin and lead elements, which does not exclude the possible presence of other elements in the bump.

Referring to FIG. 1, a substrate 10, for example a semiconductor wafer, comprises an active surface 12 on which is formed a bonding pad 16 (several bonding pads may be provided), and a passivation layer 14 covering the active surface 12 while exposing the bonding pad 16. An under bump metallurgy (UBM) 18 is formed on the bonding pad 16, and a tin-lead bump 20 is formed on the UBM 18. The tin-lead bump 20 is reflowed to form an approximately spherical shape.

Figure 2:
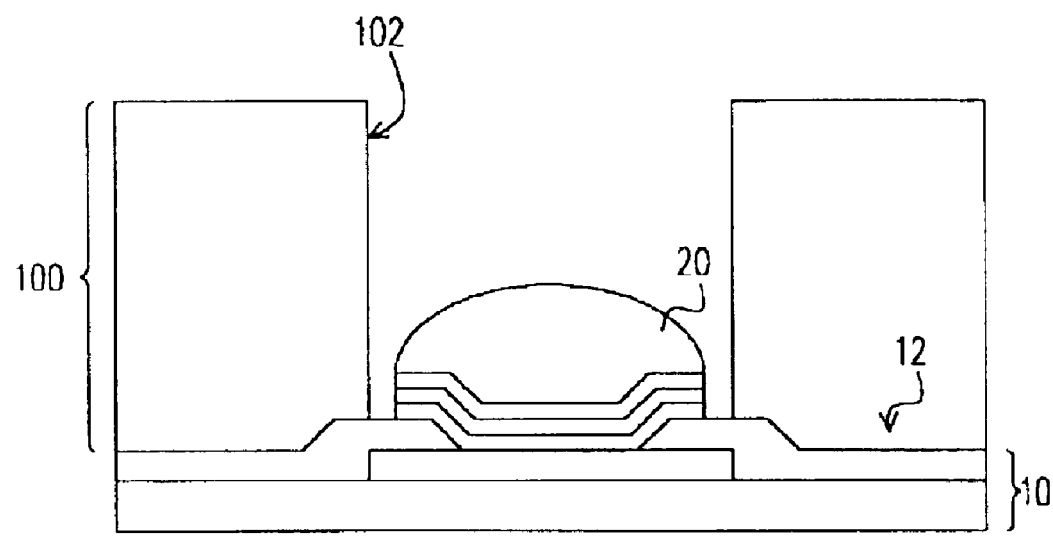

Referring to FIG. 2, a patterned solder mask 100 is formed on the active surface 12, the patterned solder mask 100 including an opening 102 that exposes the tin-lead bump 20. The patterned solder mask 100 may be formed directly on the active surface 12 by printing. Alternatively, a photoresist (not shown) first may be formed on the active surface 12. The material of the solder mask then is filled in the regions exposed through the photoresist by printing. The photoresist layer is finally removed to form the patterned solder mask 100. Alternatively, the patterned solder mask 100 may be also formed via coating a photosensitive solder mask material on the active surface 12. Through a photo-via process, the opening 102 then is formed through the solder mask material.

Figure 3:
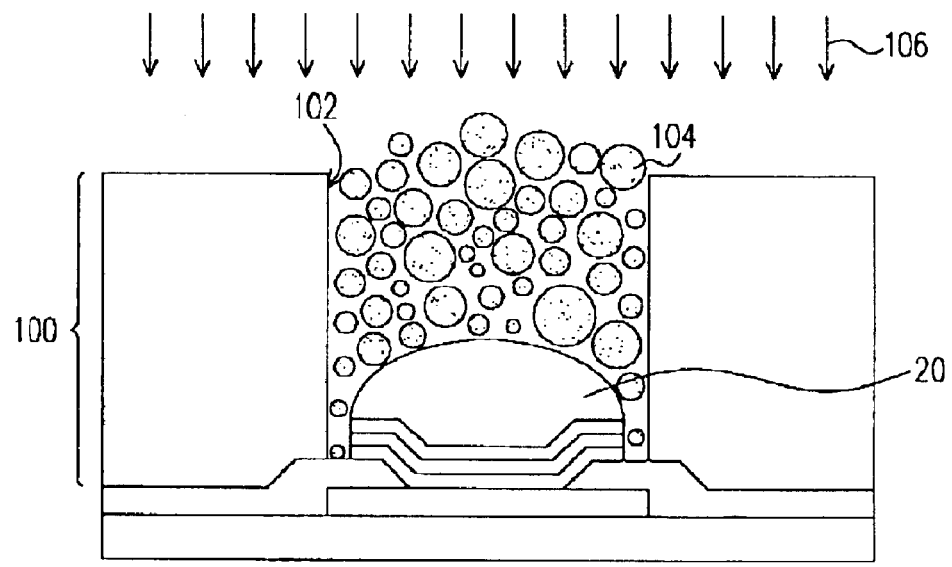

Referring to FIG. 3, the patterned solder mask includes an opening 102 that exposes the tin-lead bump 20. A gap is left between the sidewalls of the opening 102 and the surface of the tin-lead bump 20 to receive a solder material 104. By, for example, printing, the solder material 104 is filled in the opening 102 over the tin-lead bump 20. The solder material 104 is preferably made of tin-lead alloy, filled under powder or paste form. In order to modify the tin to lead ratio of the tin-lead bump 20, the tin to lead ratio of the solder material 104 has to be different from that of the tin-lead bump 20.

Figure 4:
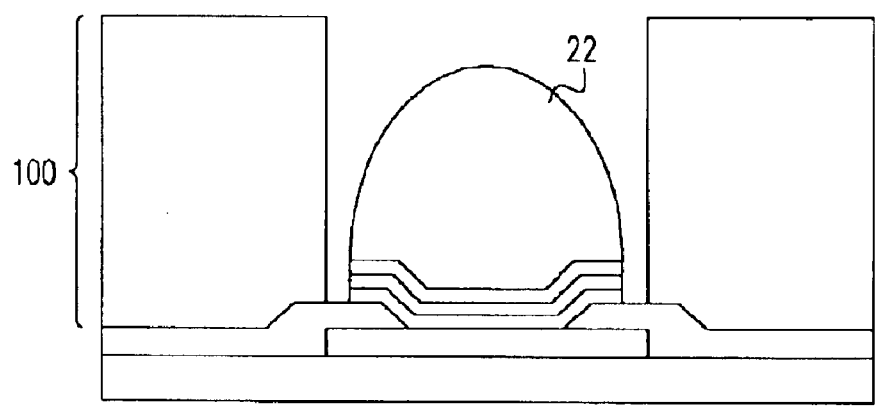

Referring to FIG. 3 and FIG. 4, a flux 106 is sprayed on the solder material 104. A reflow process is performed to fuse the solder material 104 with the tin-lead bump 20 and subsequently form a second tin-lead bump 22 having a tin to lead ratio different from that of the tin-lead bump 20. In order to obtain a substantially spherical shape of the final bump, the flux 106 alternatively may be first mixed within the solder material 104 before this latter is filled in the opening 102. A first reflow is performed to initially fuse the solder material 104 with the initial tin-lead bump 20, which forms a tin-lead bump 22 as illustrated in FIG. 4. The flux 106 is sprayed a second time over the tin-lead bump 22, and a second reflow is performed to form a final tin-lead bump that is substantially spherical.

Figure 5:
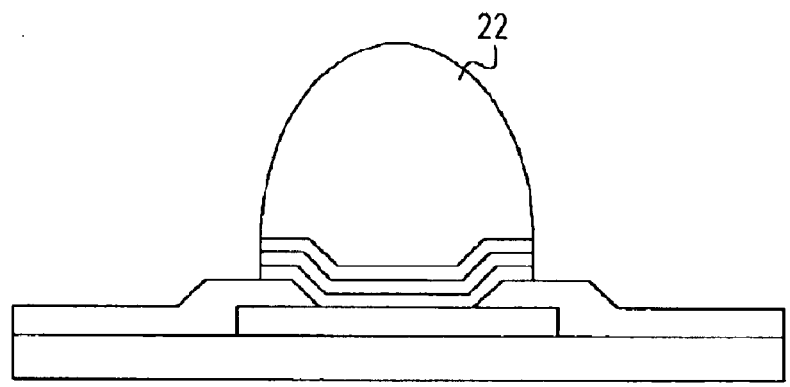

Referring to FIG. 5, after the formation of the tin-lead bump 22 is achieved, the solder mask 100 is removed to completely expose the tin-lead bump 22. Since the tin to lead ratio of the solder material 104 differs from that of the initial tin-lead bump 20, the resulting tin-lead bump 22 therefore has a tin to lead ratio that differs from that of the initial tin-lead bump 20.

The invention may be implemented to modify an initial tin to lead ratio of, for example, about 63:37 (also denoted 63Sn/37Pb) for the tin-lead bump 20 to a tin to lead ratio of, for example, about 5:95 (5Sn/95Pb) or 3:97 (3Sn/97Pb) for the tin-lead bump 22. The above example can be achieved by filling a solder material 104 that has a tin to lead ratio that is higher than that of the initial tin-lead bump (i.e. higher than 63:37). It should be understood that the above ranges are not limiting, and the invention may be advantageously implemented for other tin to lead ratio ranges.

According to the need, the invention may employ either a higher leaded solder material (i.e. including a relatively higher lead content) or a lower leaded solder material (i.e. including a relatively lower lead content) to either increase or decrease the lead content of the tin-lead bump.

As described above, the invention therefore provides a method of modifying the tin to lead ratio of a tin-lead bump that is formed on a substrate. With the method of the invention, the initial tin to lead ratio of the tin-lead bump is changed to a desired tin to lead ratio to obtain desirable physical properties, while the height of the tin-lead bump is further increased.

It should be apparent to those skilled in the art that other structures that are obtained from various modifications and variations of different parts of the above-described structures of the invention would be possible without departing from the scope and spirit of the invention as illustrated herein. Therefore, the above description of embodiments and examples only illustrates specific ways of making and performing the invention that, consequently, should cover variations and modifications thereof, provided they fall within the inventive concepts as defined in the following claims.

What is claimed is:

1. A method of modifying the tin to lead ratio of a tin-lead bump, comprising:

providing a substrate, that has an active surface on which are formed a plurality of first tin-lead bumps comprised of tin-lead;

forming a patterned solder mask over the active surface, the patterned solder mask including a plurality of openings that respectively expose the first tin-lead bumps;

filling a solder material in the openings;

performing a reflow process to fuse the solder material with the first tin-lead bumps to merge into a plurality of second tin-lead bumps, wherein a tin to lead ratio of the second tin-lead bumps differs from that of the first tin-lead bumps, while a height of the second tin-lead bumps is larger than that of the first tin-lead bumps; and removing the patterned solder mask.

2. The method of claim 1, wherein the solder material includes an alloy of tin and lead the ratio of which differs from a tin to lead ratio of the first tin-lead bumps.

3. The method of claim 1, wherein the solder material is filled under powder form.

4. The method of claim 1, wherein the solder material is filled under paste form.

5. The method of claim 1, wherein the patterned solder mask is formed by printing.

6. The method of claim 1, wherein the patterned solder mask is formed via coating a solder mask layer over the active surface, and defining the openings in the solder mask layer.

7. The method of claim 6, wherein the openings of the patterned solder mask are formed according to a photo-via process.

8. A tin-lead bump fabrication method, comprising:

providing a substrate having an active surface on which is formed a plurality of bonding pads, a passivation layer being formed on the active surface in a manner to expose the bonding pads;

forming a plurality of first tin-lead bumps respectively on the bonding pads;

forming a patterned solder mask over the active surface of the substrate, the patterned solder mask including a plurality of openings that respectively expose the first tin-lead bumps;

filling a solder material in the openings of the patterned solder mask;

performing a reflow process to fuse the solder material with the first tin-lead bumps to merge into a plurality of second tin-lead bumps, wherein a tin to lead ratio of the second tin-lead bumps differs from that of the first tin-lead bumps, while a height of the second tin-lead bumps is larger than that of the first tin-lead bumps; and removing the patterned solder mask.

9. The method of claim 8, wherein the solder material includes an alloy of tin and lead the ratio of which differs from a tin to lead ratio of the first tin-lead bumps.

10. The method of claim 8, wherein the solder material is filled under powder form.

11. The method of claim 8, wherein the solder material is filled under paste form.

12. The method of claim 8, wherein the patterned solder mask is formed by printing.

13. The method of claim 8, wherein the patterned solder mask is formed via coating solder mask layer over the active surface of the substrate, and defining the openings in the solder mask layer.

14. The method of claim 13, wherein the openings of the patterned solder mask are formed according to a photo-via process.

15. The method of claim 8, further comprising forming a plurality of under bump metallurgy (UBM) respectively on the bonding pads before the tin-lead bumps are formed, the tin-lead bumps being respectively formed on the UBM.

* * * * *